(12) United States Patent
Zhang et al.

(10) Patent No.: US 8,084,996 B2
(45) Date of Patent: Dec. 27, 2011

(54) METHOD FOR BATTERY CAPACITY ESTIMATION

(75) Inventors: Xiaodong Zhang, Mason, OH (US);
Xidong Tang, Sterling Heights, MI (US); Jian Lin, Beverly Hills, MI (US);
Yilu Zhang, Northville, MI (US);
Mutasim A. Salman, Rochester Hills, MI (US); Yuen-Kwok Chin, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 687 days.

(21) Appl. No.: 12/147,539

(22) Filed: Jun. 27, 2008

(65) Prior Publication Data

US 2009/0322283 A1 Dec. 31, 2009

(51) Int. Cl.
*H02J 7/00* (2006.01)
*G01N 27/416* (2006.01)
(52) U.S. Cl. ........................ 320/132; 324/427
(58) Field of Classification Search .................. 320/132; 324/427
See application file for complete search history.

(56) References Cited

U.S. PATENT DOCUMENTS

| | | | |
|---|---|---|---|
| 4,937,528 A | 6/1990 | Palanisamy | |
| 6,356,083 B1 | 3/2002 | Ying | |
| 6,501,250 B2 | 12/2002 | Bito et al. | |
| 7,554,297 B2* | 6/2009 | Sada et al. | 320/132 |
| 7,649,338 B2* | 1/2010 | Seo et al. | 320/132 |
| 7,679,329 B2* | 3/2010 | Lim et al. | 320/132 |
| 7,928,735 B2* | 4/2011 | Huang et al. | 324/426 |
| 2003/0184307 A1 | 10/2003 | Kozlowski et al. | |
| 2008/0054848 A1* | 3/2008 | Yun et al. | 320/134 |
| 2009/0037124 A1* | 2/2009 | Majima | 702/63 |

FOREIGN PATENT DOCUMENTS

EP 1632781 3/2006

OTHER PUBLICATIONS

Journal of Power Sources, Vehicle Electric Power Systems are Under Change! Implications for Design, Monitoring and Management of Automotive Batteries, Eberhard Meissner, et al, No. 95, pp. 12-23, 2001.
Journal of the Electrochemical Society, Adaptive Energy Management of Electric and Hybrid Electric Vehicles, Mark Verbrugge et al. 152(2), A333-A342, 2005.

* cited by examiner

*Primary Examiner* — M'Baye Diao

(57) ABSTRACT

An embodiment contemplates a method for estimating a capacity of a battery. A state of charge is determined at a first instant of time and at a second instant of time. A difference in the state of charge is determined between the first instant of time and the second instant of time. A net coulomb flow is calculated between the first instant of time and the second instant of time. The battery capacity is determined as a function of the change in the state of charge and the net coulomb flow.

19 Claims, 2 Drawing Sheets

METHOD FOR BATTERY CAPACITY ESTIMATION

BACKGROUND OF INVENTION

The present invention relates generally to determining a state of health (SOH) of a rechargeable battery in a transportation vehicle.

A vehicle's electric power supply system must support a plurality of vehicle functions that operate on electric energy. Such functions include normal vehicle operation devices and safety related devices such as rear window defogger, anti-lock braking/stability systems, lighting systems, etc. In addition to these devices, the vehicle's electric power supply system supports comfort, convenience, and entertainment devices. Some examples include air conditioning, heated seats, video/audio systems, and accessory outlet convenience devices. With the advent of new X-by-wire technologies (e.g., steer-by-wire, brake-by-wire, etc.) even more electric power is being demanded of the vehicle's electrical power system.

The increasing use of electrical devices as described above directly affects the drain on the vehicle battery, and hence, the battery's useful life. The acceleration of battery aging has a direct correlation with the frequency of use of such devices, which uses the vehicle battery as their power source.

Moreover, hybrid electric vehicle applications utilize both electric drive systems and internal combustion engines. Such systems require more energy from a vehicle battery than a typical internal combustion engine system. The operating modes of hybrid vehicles are typically described as charge depleting or charge sustaining with reference to the battery pack. Some hybrids can be charged off an electrical grid, whereas most hybrids operating in a charge sustaining mode receive the electric charging from an alternator driven by the internal combustion engine. Therefore, hybrid systems use high power rechargeable batteries to meet the power requirement. With high power output and more frequent usage of the batteries, accurate and robust capacity estimation is needed for battery SOH monitoring to ensure reliable and safe operation of hybrid systems. In addition, an accurate capacity estimate can be further utilized to enhance state of charge estimation and electric power management.

A known method used to determine battery capacity measurements is to use a time-consuming full charging and discharging process in a laboratory environment which is not suitable for on-board vehicle applications.

SUMMARY OF INVENTION

One advantage of the invention is the ability to estimate battery capacity in an on-board vehicle system as opposed to a laboratory environment. A voltage-based state of charge (SOC) of the battery is estimated in an electronic control module using voltage and current signals measured over time intervals for determining the battery capacity, which assists in monitoring the battery state of health as well as enhancement of battery charging control and vehicle power management.

An embodiment contemplates a method for estimating a capacity of a battery. A state of charge is determined at a first instant of time and at a second instant of time. A difference in the state of charge is determined between the first instant of time and the second instant of time. A net coulomb flow is calculated between the first instant of time and the second instant of time. The battery capacity is determined as a function of the change in the state of charge and the net coulomb flow.

An embodiment contemplates an apparatus for determining a capacity of a battery. The apparatus includes at least one sensor for monitoring a characteristic of the battery and an electronic control module. The electronic control module is coupled to the at least one sensor for receiving a sensed input signal. The electronic control module includes a processing unit for determining a difference in a state of charge between a first instance of time and a second instance of time. The processing unit determines a net coulomb flow between the first instance of time and the second instance of time. The processing unit further determines the battery capacity as a function of the difference in the state of charge and the net coulomb flow.

DETAILED DESCRIPTION

Figure 1:
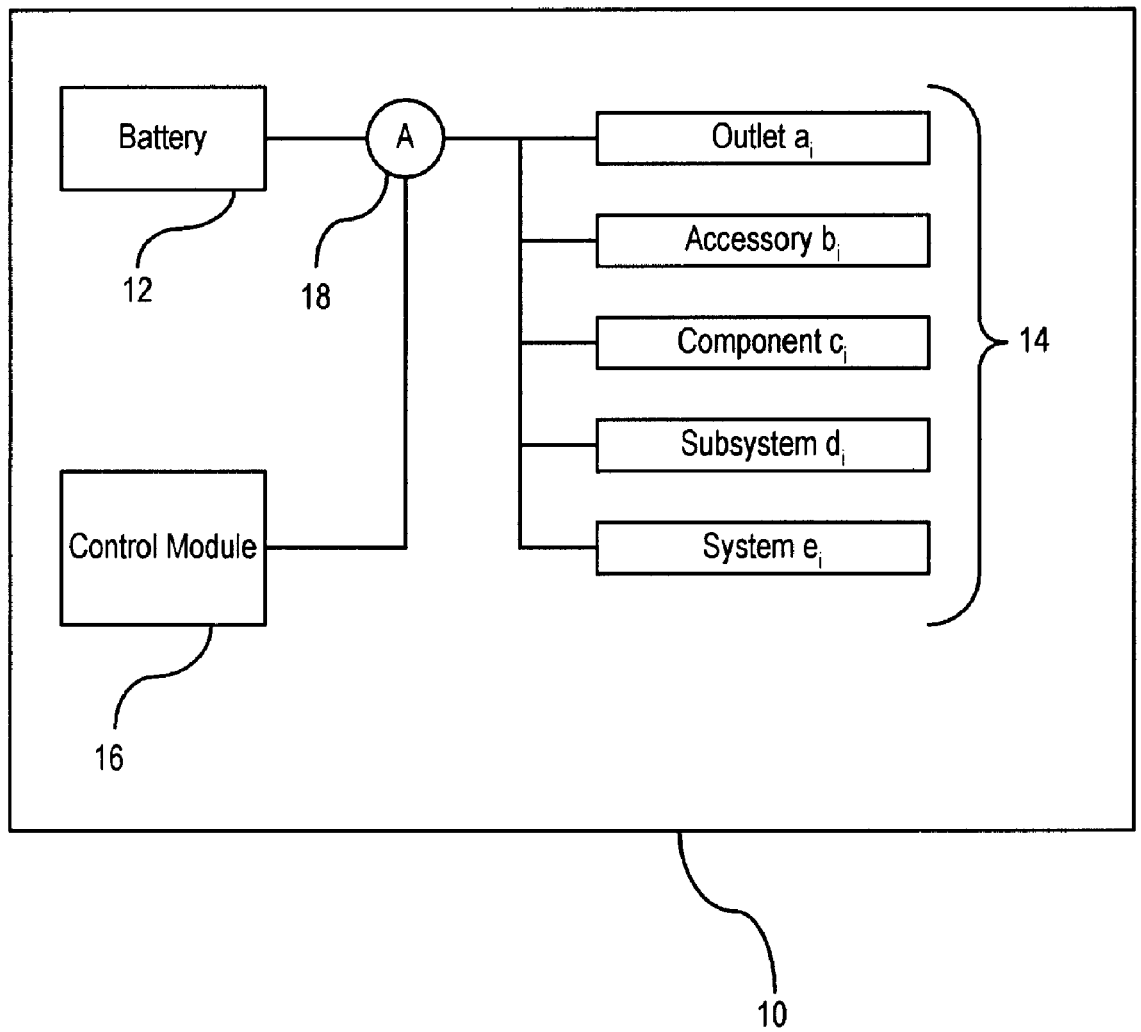
FIG. 1 is a diagrammatic representation of an embodiment of a vehicle having a battery state of health estimation system according to an embodiment.

FIG. 1 illustrates a diagrammatic representation of an embodiment of a vehicle 10 incorporating a battery capacity estimation system therein. It should be understood that the vehicle may be a hybrid vehicle, internal combustion vehicle, or an electric vehicle. The vehicle 10 includes a battery pack 12 having a single battery or a plurality of individual battery modules. For example, an embodiment may include a plurality of batteries connected in series to produce a high voltage nominal voltage (e.g., 336 volts) for an electric or hybrid vehicle, although any practical voltage can be accommodated. In yet another embodiment, the vehicle may include a single 12 volt battery producing a 14 volt nominal voltage for an internal combustion vehicle. The state of health estimation technique described herein may be applicable to variety of battery types, including but not limited to, nickel metal hydride (NiMH) batteries, lead acid batteries, or lithium ion batteries.

The vehicle battery 12 is coupled to a plurality of devices 14 which utilize the battery as a power source. Such devices may include power outlets adapted to an external plug in device, accessories, components, subsystems, and systems associated with an internal combustion vehicle, a hybrid vehicle, or an electric vehicle. The vehicle 10 may further include a control module 16, or like module, which obtains, derives, monitors, and/or processes a set of parameters associated with vehicle battery 12. These parameters may include, without limitation, current, voltage, state of charge (SOC), state of health (SOH), battery internal resistances, battery internal reactances, battery temperature, and power output of the vehicle battery. The control module includes an algorithm, or like, for executing a vehicle battery capacity estimation technique. A current sensor 18 may also be used to monitor a supply current leaving the vehicle battery 12. In a hybrid vehicle or electric vehicle, it is typical that a current sensor 18 is integral to the control module 16. The system may also include a voltmeter (not shown) for measuring a voltage so that an open circuit voltage may be determined.

To enhance battery charging control and vehicle power management, the battery capacity estimation system uses the SOC which is an index associated with the battery state to determine the battery capacity. In a first embodiment, an open circuit voltage $V_{oc}$ is used to estimate the SOC. The open circuit voltage $V_{oc}$ can be determined when the battery is at rest for at least a predetermined period of time. The open circuit voltage $V_{oc}$ can also be estimated when the vehicle is operating. Various techniques may be used to determine the SOC using the open circuit voltage $V_{oc}$. Examples of such techniques used for determining the SOC based on the open circuit voltage $V_{oc}$ directly measured and/or indirectly estimated from battery parameters may include, but are not limited to, those techniques described in U.S. Pat. No. 6,639,385 to Verbrugge and U.S. Publication 2004/0162683 to Verbrugge which describe techniques for estimating the open circuit voltage $V_{oc}$ and correlating it to the SOC. Pending application having Ser. No. 11/867,497 having a filing date of Oct. 4, 2007 describes a technique of sampling the terminal voltage data and current data to calculate an open circuit voltage $V_{oc}$ which may then be used to generate a SOC value. The relevant content of these patent documents and pending applications are incorporated herein by reference. In alternative embodiments, the SOC may be derived using other known techniques that do not require the open circuit voltage $V_{oc}$.

In one embodiment, a first state of charge ($SOC_1$) is determined at a first instance of time $T_1$ and a second state of charge ($SOC_2$) is determined at a second instance of time $T_2$. The time instances at which $SOC_1$ and $SOC_2$ are determined may be fixed instances of time. Alternatively, the time instances may be variable dependent upon the validity of the SOC. That is, when $SOC_1$ and $SOC_2$ may be sampled at various time instances, the validity of $SOC_1$ and $SOC_2$ are made based on whether the change in a state of charge ($\Delta SOC$) has the same sign as the change in a current-based SOC and is within a respective range compared with the change in the current-based SOC. For example, in a hybrid vehicle, a change within a predetermined percentage deviation (e.g., 5%) from the current-based SOC change would be considered valid. If the change has a different sign or is outside of respective range compared with the current-based SOC change, then $SOC_1$ and $SOC_2$ determined at the respective time instances are considered invalid. Sampling for new values of $SOC_1$ and $SOC_2$ may be made at a new time instances. Additionally, performance indices of the voltage-based SOC estimation method can also be used to determine the validity of $SOC_1$ and $SOC_2$ (e.g., signal richness, estimation error of parameter estimation methods). Once a determination is made that the change in the state of charge ($\Delta SOC$) is valid, the difference $\Delta SOC$ is used to estimate the battery capacity.

The difference in the state of charge ($\Delta SOC$) is represented by the formula:

$$\Delta SOC = SOC_1 - SOC_2$$

Since $SOC_1$ and $SOC_2$ are voltage-based, the difference in the state of charge ($\Delta SOC$) is computed without using the vehicle battery capacity. As a result, the $\Delta SOC$ may be used as a comparative reference to derive the battery capacity. It should be noted that $SOC_1$ and $SOC_2$ may be derived as voltage based SOC or a non-voltage based SOC. Moreover, the methods used for determining $SOC_1$ and $SOC_2$ may be methods that are independent of battery capacity.

The electrical control unit 14 further determines a net coulomb flow $\Delta Q$ for battery capacity estimation. The net coulomb flow $\Delta Q$ is a function of the coulomb flow computed between the first instance of the time $T_1$ and the second instance of time $T_2$. The net coulomb flow $\Delta Q$ is represented by the formula:

$$\Delta Q = \int_{T_1}^{T_2} \eta \cdot I(t) dt$$

where $T_1$ is the first instance of time, $T_2$ is the second instant of time, $\eta$ represents the charging and discharging efficiency, and I is the current.

In a hybrid vehicle the net coulomb flow is computed at a battery control module. The battery control module in a hybrid vehicle performs battery charging control and enhances vehicle power management. In a vehicle having an internal combustion engine, a current sensor is used to monitor the current flow from the vehicle battery and is provided to a body control module for determining the net coulomb flow $\Delta Q$.

The battery capacity is then determined as a function of the $\Delta SOC$, as determined by the difference between $SOC_1$ and $SOC_2$, and the net coulomb flow $\Delta Q$. The battery capacity which is indication of the battery state of health (SOH) may be represented by the following formula:

$$C_n = \frac{\Delta Q}{\Delta SOC}$$

Figure 2:
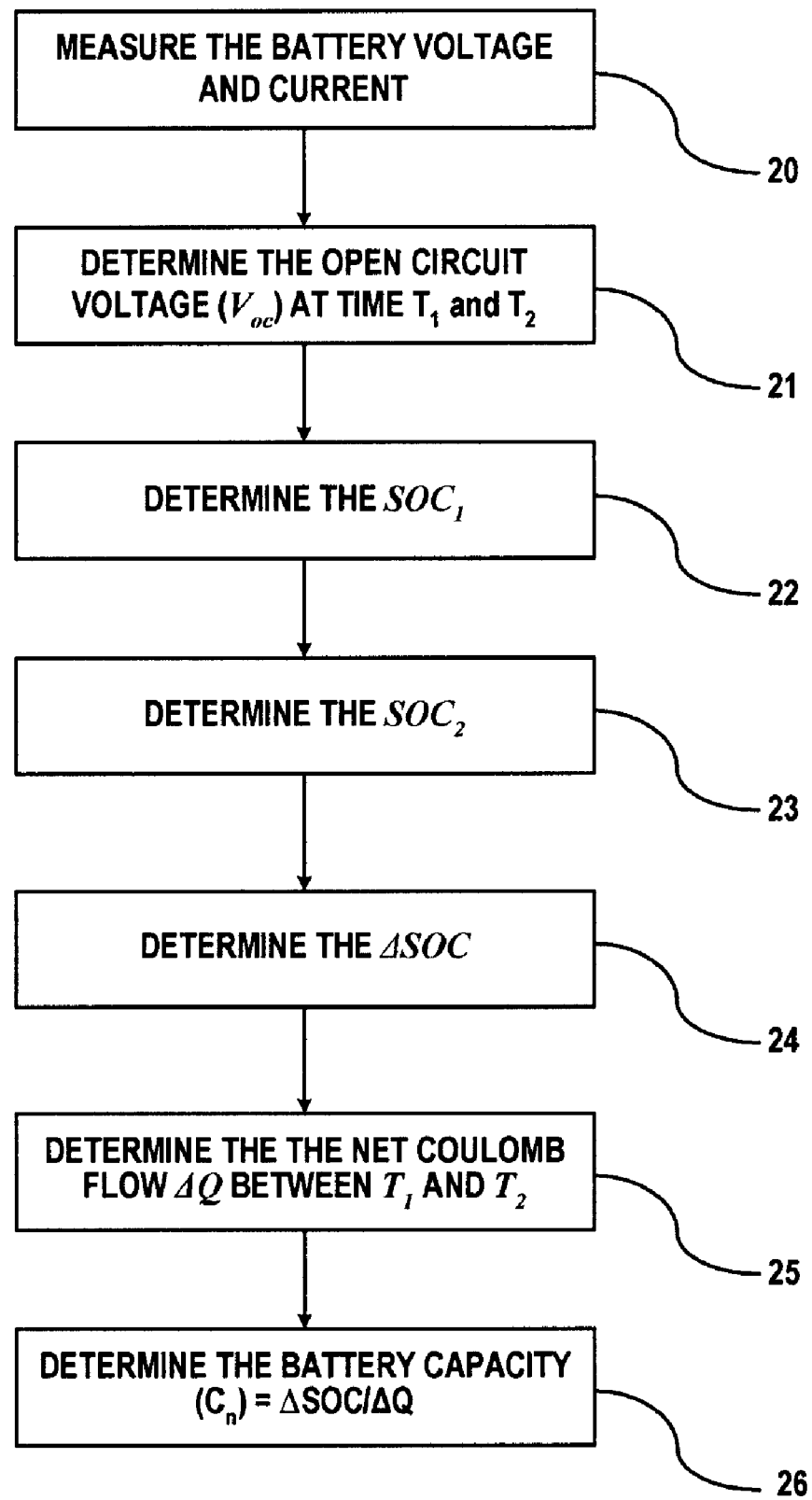
FIG. 2 is a flowchart of a method for estimating the battery capacity of the vehicle according to an embodiment.

FIG. 2 illustrates a method for estimating the battery capacity ($C_n$) of the vehicle battery. In step 20, battery voltage and current are measured. In step 21, the measured battery voltage and current are used for determining the open circuit voltage $V_{oc}$. The open circuit voltage $V_{oc}$ may be determined using a parameter identification method based on an equivalent circuit battery model. In a hybrid vehicle, the open circuit voltage $V_{oc}$ is preferably determined when the vehicle is operating. In an internal combustion engine, the open circuit voltage $V_{oc}$ is preferably determined when the battery is at rest; more preferably, after a predetermined period of time at rest. The open circuit voltage $V_{oc}$ is determined at a first instance of time $T_1$ and a second instance of time $T_2$.

In step 22, $SOC_1$ is determined at $T_1$. In step 23, $SOC_2$ is determined at $T_2$. $SOC_1$ and $SOC_2$ are determined as a function of the open circuit voltage $V_{oc}$. $T_1$ and $T_2$ may be instances of time that are fixed or may be variable.

In step 24, a difference in the state of charge $\Delta SOC$ is determined by subtracting $SOC_2$ from $SOC_1$. If $T_1$ and $T_2$ are variable (i.e., taken during a sampling), then a validity check is made to determine if the $\Delta SOC$ is valid. This determination may be made by comparing the $\Delta SOC$ to a change in the current-based SOC and determining if the $\Delta SOC$ is within an expected range. If the determination is made that $\Delta SOC$ is invalid, then new sampling values are taken at different time instances for the open circuit voltage $V_{oc}$ to obtain new state of charge values for $SOC_1$ and $SOC_2$. In addition, the open circuit voltage $V_{oc}$ may be recorded for multiple sampling times to derive multiple $\Delta SOC$ values and in turn multiple battery capacity estimates $C_n$ which may be filtered to generate an average battery capacity to improve robustness and accuracy.

In step 25, the net coulomb flow $\Delta Q$ is determined between the first instance of time $T_1$ and the second instance of time $T_2$. The net coulomb flow $\Delta Q$ is amp hour change between the first instance of time $T_1$ and the second instance of time $T_2$. The coulomb flow is typically calculated by accumulating sampled current over the sampling time interval.

In step 26, the battery capacity is derived as a function of the difference in the state of charge $\Delta SOC$ and the net coulomb flow ΔQ. The battery capacity is then combined with other parameters such as battery resistance to offer on-board vehicle state of health (SOH). The SOH value can be used to more appropriately manage power utilization and/or to report the SOH to a driver of the vehicle.

While the above embodiment describes a method of on-board vehicle SOH monitoring, the above methods and techniques may be applied to testing the battery off the vehicle.

While certain embodiments of the present invention have been described in detail, those familiar with the art to which this invention relates will recognize various alternative designs and embodiments for practicing the invention as defined by the following claims.

What is claimed is:

1. A method of estimating a battery capacity for a battery, the method comprising the steps of:
    (a) determining a state of charge at a first instant of time and at a second instant of time independent of battery capacity;
    (b) determining a difference in the state of charge between the first instant of time and the second instant of time;
    (c) calculating a net coulomb flow between the first instant of time and the second instant of time; and
    (d) determining the battery capacity as a function of the change in the state of charge and the net coulomb flow.

2. The method of claim 1 wherein determining the battery capacity in step (d) is derived from the formula:

$$\frac{\Delta Q}{\Delta SOC}$$

where ΔQ is the net coulomb flow between the first instant of time and the second instant of time, and ΔSOC is the difference in the state of charge between the first instant of time and the second instant of time.

3. The method of claim 1 wherein calculating the net coulomb flow in step (c) is derived from the formula:

$$\Delta Q = \int_{T_1}^{T_2} \eta \cdot I(t) dt$$

where ΔQ is the net coulomb flow, $T_1$ is the first instance of time, T2 is the second instant of time, η is a constant representing the charging and discharging efficiency, and I is the current.

4. The method of claim 1 wherein the state of charge determined at the first instance of time and the second instance of time is a voltage based state of charge.

5. The method of claim 4 wherein the state of charge determined at the first instance of time and the second instance of time are determined as a function of open circuit voltages at the first instance of time and the second instance of time.

6. The method of claim 5 wherein the voltage measurements used for determining the open circuit voltages at the first and second instances of time are determined when the vehicle is being driven.

7. The method of claim 5 wherein the voltage measured for determining the open circuit voltages at the first and second instances of time are performed when the vehicle is at rest.

8. The method of claim 7 wherein the voltage measured for determining the open circuit voltages at the first and second instances of time are performed when the vehicle is at rest for at least a duration of time.

9. The method of claim 5 wherein the open circuit voltage is determined using a parameter identification process based on an equivalent circuit battery model.

10. The method of claim 1 wherein the state of charge as determined by the open circuit voltage is determined using a lookup table.

11. The method of claim 1 wherein the first instance of time and the second instance of time are fixed instances of time.

12. The method of claim 1 wherein the first instance of time and the second instance of time are determined based on whether a respective measured state of charge is valid.

13. The method of claim 1 wherein the state of charge is a voltage-based state of charge.

14. An apparatus for determining a battery capacity for a battery, the apparatus comprising: at least one sensor for monitoring a characteristic of the vehicle battery; and an electronic control module coupled to the at least one sensor for receiving a sensed input signal, the electronic control module including a processing unit for determining a difference in a state of charge between a first instance of time and a second instance of time independent of battery capacity, the processing unit determining a net coulomb flow between the first instance of time and the second instance of time, the processing unit further determining the battery capacity as a function of the difference in the state of charge and the net coulomb flow.

15. The apparatus of claim 14 wherein the electronic control module is a battery control module.

16. The apparatus of claim 14 wherein the electronic control module is a body control module.

17. The apparatus of claim 16 wherein the at least one sensor is a current sensor in communication with the body control module for providing sensed current signals to the body control module for determining the net coulomb flow.

18. The apparatus of claim 14 wherein the processing unit determines the net difference in a state of charge as a function of the open circuit voltage.

19. A method of estimating a battery capacity for a battery, the method comprising the steps of:
    (a) determining a state of charge at a first instant of time and at a second instant of time;
    (b) determining a difference in the state of charge between the first instant of time and the second instant of time;
    (c) calculating a net coulomb flow between the first instant of time and the second instant of time; and
    (d) determining the battery capacity as a function of the change in the state of charge and the net coulomb flow;
    wherein steps (a)-(d) are repeated for determining a plurality of battery capacities over multiple intervals, the plurality of battery capacities being filtered for providing a factored battery capacity value.

* * * * *